United States Patent [19]

Moriyasu et al.

[11] 4,225,940
[45] Sep. 30, 1980

[54] OSCILLOSCOPE SYSTEM FOR ACQUIRING, PROCESSING, AND DISPLAYING INFORMATION

[75] Inventors: Hiro Moriyasu, Portland; Jack A. Gilmore, Aloha; Willem B. Velsink, Beaverton; Luis J. Havarro, Portland, all of Oreg.

[73] Assignee: Tektronix, Inc., Beaverton, Oreg.

[21] Appl. No.: 948,068

[22] Filed: Oct. 2, 1978

Related U.S. Application Data

[63] Continuation of Ser. No. 736,677, Oct. 28, 1976, abandoned, which is a continuation of Ser. No. 631,345, Nov. 12, 1975, abandoned, which is a continuation of Ser. No. 321,876, Jan. 8, 1973, abandoned.

[51] Int. Cl.² .............. G06F 3/05; G01R 13/20; G06F 5/00; G06F 13/00
[52] U.S. Cl. .............. 364/900; 324/121 R; 340/745; 315/367; 315/379; 340/347 SH; 340/347 R
[58] Field of Search ... 364/200 MS File, 900 MS File, 364/521, 487; 315/365, 366, 367, 379; 346/110 R, 33 C, 33 WL; 324/77 R, 77 B, 78 E, 121 R, 77 A; 367/68, 69, 71; 340/347, 721, 722, 723, 736, 745, 747; 328/104, 154; 307/243

[56] References Cited

U.S. PATENT DOCUMENTS

| | | | |
|---|---|---|---|
| 3,153,763 | 10/1964 | Uphoff | 328/104 |
| 3,344,407 | 9/1967 | Koeijmans | 340/172.5 |
| 3,345,616 | 10/1967 | Avril | 340/172.5 |
| 3,380,028 | 4/1968 | Gustafson | 340/721 |
| 3,406,387 | 10/1968 | Werme | 340/324 |
| 3,439,342 | 4/1969 | Barton | 340/172 S |
| 3,506,813 | 4/1970 | Trimble | 324/77 R |
| 3,512,131 | 5/1970 | Nelson | 340/172 S |
| 3,514,759 | 5/1970 | Watanabe | 340/172 S |
| 3,514,762 | 5/1970 | Sloane | 340/172 S |
| 3,585,440 | 6/1971 | Lee | 340/324 |
| 3,621,214 | 11/1971 | Romney | 235/151 |
| 3,629,841 | 12/1971 | Hare | 364/900 |
| 3,629,844 | 12/1971 | Dancis | 340/172 S |
| 3,648,250 | 3/1972 | Luw | 340/172 S |
| 3,651,510 | 3/1972 | Gilbert | 340/324 A |
| 3,652,999 | 3/1972 | Hjort | 340/172 S |
| 3,653,027 | 3/1972 | Scheer | 340/324 A |
| 3,662,380 | 5/1972 | Cargile | 340/324 AD |
| 3,736,564 | 5/1972 | Watkins | 340/172 S |
| 3,765,009 | 10/1973 | Graves | 340/324 A |
| 3,792,463 | 2/1974 | Eriksson | 340/723 |
| 3,859,556 | 1/1975 | Schumann | 315/367 |
| 3,872,461 | 3/1975 | Jarosik | 315/365 |

OTHER PUBLICATIONS

"Tektronix Oscilloscopes & Associated Instruments", 1970 Catalog, pp. 100-101, 127.

Primary Examiner—James D. Thomas
Attorney, Agent, or Firm—George T. Noe

[57] ABSTRACT

A general-purpose oscilloscope system is disclosed wherein waveforms acquired by the vertical and horizontal preamplifier channels can be displayed immediately, or they can be digitized and stored in a memory from where they can be recalled, reconstituted in their analog form and displayed at a later time. The processing system permits simultaneous display of instantaneous and processed waveforms, and includes facilities for processing associated z-axis signals and readout data as well. Access to peripheral equipment, such as a computer or the like, permits the digitized waveforms to be mathematically manipulated and returned to the memory in the processing system for ultimate display. The oscilloscope system can be assembled in a modular manner, whereby the processing unit becomes an integral part of the instrument, or the system can be assembled as a general-purpose oscilloscope without the processing unit, allowing a user to add the processing capability to his system at a later time.

4 Claims, 5 Drawing Figures

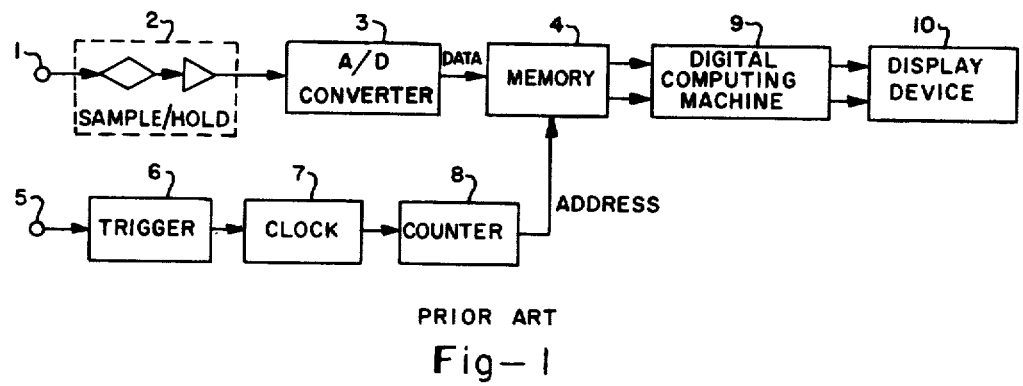
PRIOR ART
Fig—1
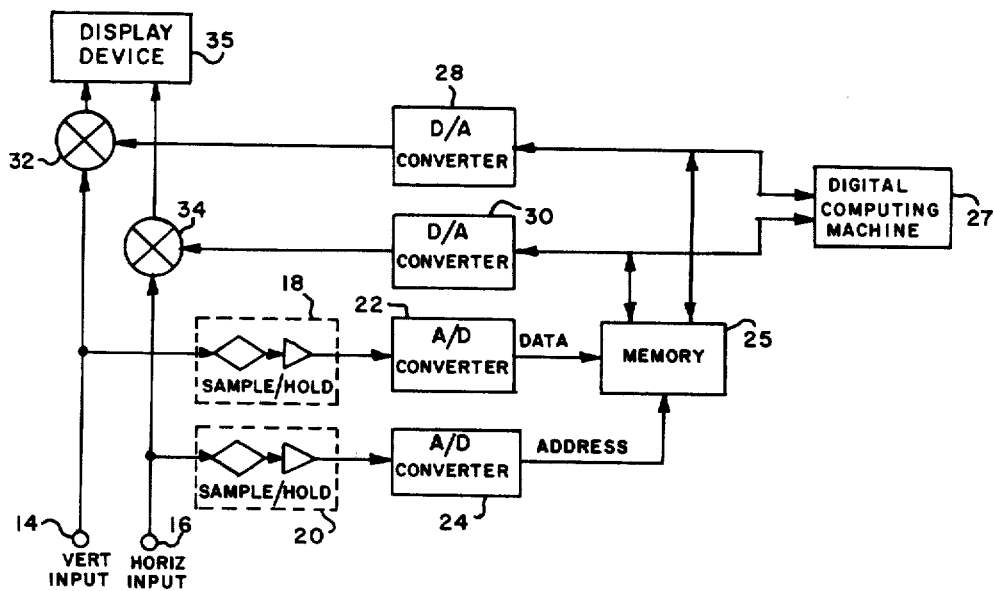
Fig—2

OSCILLOSCOPE SYSTEM FOR ACQUIRING, PROCESSING, AND DISPLAYING INFORMATION

This is a continuation of Ser. No. 736,677, filed Oct. 28, 1976, now abandoned which is a continuation of Ser. No. 631,345, filed Nov. 12, 1975, now abandoned which is a continuation of Ser. No. 321,876, filed Jan. 8, 1973, now abandoned.

BACKGROUND OF THE INVENTION

Many attempts have been made to retain and analyze waveform data associated with display systems, such as oscilloscopes and the like. The development of the storage cathode ray tube permitted waveforms to be displayed on an oscilloscope screen for extended periods of time; however, this system lacked versatility. A "split-screen" technique increased the capability by permitting two waveforms to be viewed simultaneously in any combination of stored and non-stored operating modes. To analyze these waveforms, or to perform any mathematical functions thereon, it was necessary for the operator to simulate the waveforms on paper and mentally calculate the desired results. For example, to obtain an electrical power curve from voltage and current waveforms, the tedious operation of point-by-point multiplication of the corresponding points on the voltage and current waveforms was performed, from which the points of the power waveform could be obtained. A major disadvantage of storage cathode-ray tubes for waveform analysis is that information stored thereon can be held for only a limited time. If a particular waveform was needed beyond the storage time limit, it became necessary to photograph such waveform or provide a facsimile.

One form of waveform processing was developed which was capable of categorizing waveform information on one axis only, usually the vertical axis. This system digitized the information and stored it in a memory bank, such as a core memory or a memory register. This information was then available to the display system on a recall basis to provide a refreshed display. However, this system also had its limitations, and one major disadvantage was its extremely narrow bandwidth capability. The system was locked to a timing signal or clock signal which was compatible to a computer and the single-axis information was processed at that rate. Because of slow sweep speeds required to display such processed information, it was impractical to simultaneously view real-time signals which were generally occurring at higher frequencies. While two or more such single-axis signals could be processed in this manner, which could include manipulation by a computer or the like, another serious disadvantage to previous systems was that due to differences in sweep timing and linearity, etc. the identical initial conditions could not be repeated, rendering the accuracy of such processed waveforms questionable and unreliable.

SUMMARY OF THE INVENTION

According to the present invention, information corresponding to each major axis of a Cartesian-coordinate system display, for example, vertical, horizontal, and z axes, can be categorized simultaneously. Such simultaneous categorization permits wide bandwidth operation, overcoming a previous major disadvantage. In addition to waveform information, this system has the capability of categorizing associated alpha-numeric data related thereto. A unique sampling circuit, which employs a delayed horizontal sampling strobe to remove the need for the conventional vertical delay line and its compensation, takes samples of vertical and horizontal waveforms; such samples are then digitized by conventional A/D converters and then stored in precise coordinate relationship in a memory device. The present invention is capable of storing several such waveforms and associated alpha-numeric data. These waveforms and data can be recalled for display as desired, or sent to a compatible computer via a direct interface for further processing, such as storage or mathematical operations thereon, and then returned to the system of the present invention for ultimate display. For example, a signal generated in the time domain can be displayed in the frequency domain using a Fast Fourier Transform technique.

It is therefore one object of the present invention to acquire, process, and display wide bandwidth information corresponding to at least two major axes of a Cartesian coordinate system.

It is another object of the present invention to display both instantaneous signals and processed signal information simultaneously on the same cathode-ray tube.

It is a further object of the present invention to match real-time characteristics of the signal by categorizing both vertical and horizontal information.

It is yet another object of the present invention to provide a sampling system capable of sampling both vertical and horizontal signals to provide information corresponding to a coordinate point, without delaying the vertical signal or using a horizontal pretriggering scheme.

It is yet a further object of the present invention to store and display alpha-numeric data corresponding to stored waveforms.

It is still another object of the present invention to provide a flexible display system in which waveforms and related data can be processed by a computer prior to display.

Other objects and attainments of the present invention will become apparent to those skilled in the art upon a reading of the following detailed description when taken in conjunction with the drawings in which there are shown and described illustrative embodiments of the invention. It is to be understood, however, that these embodiments are not intended to be exhaustive nor limiting to the invention.

DRAWINGS

FIG. 1 shows a block diagram of a waveform processing system according to the prior art;

FIG. 2 shows a general block diagram of the waveform processing and display system according to the present invention;

DETAILED DESCRIPTION

Figure 3:
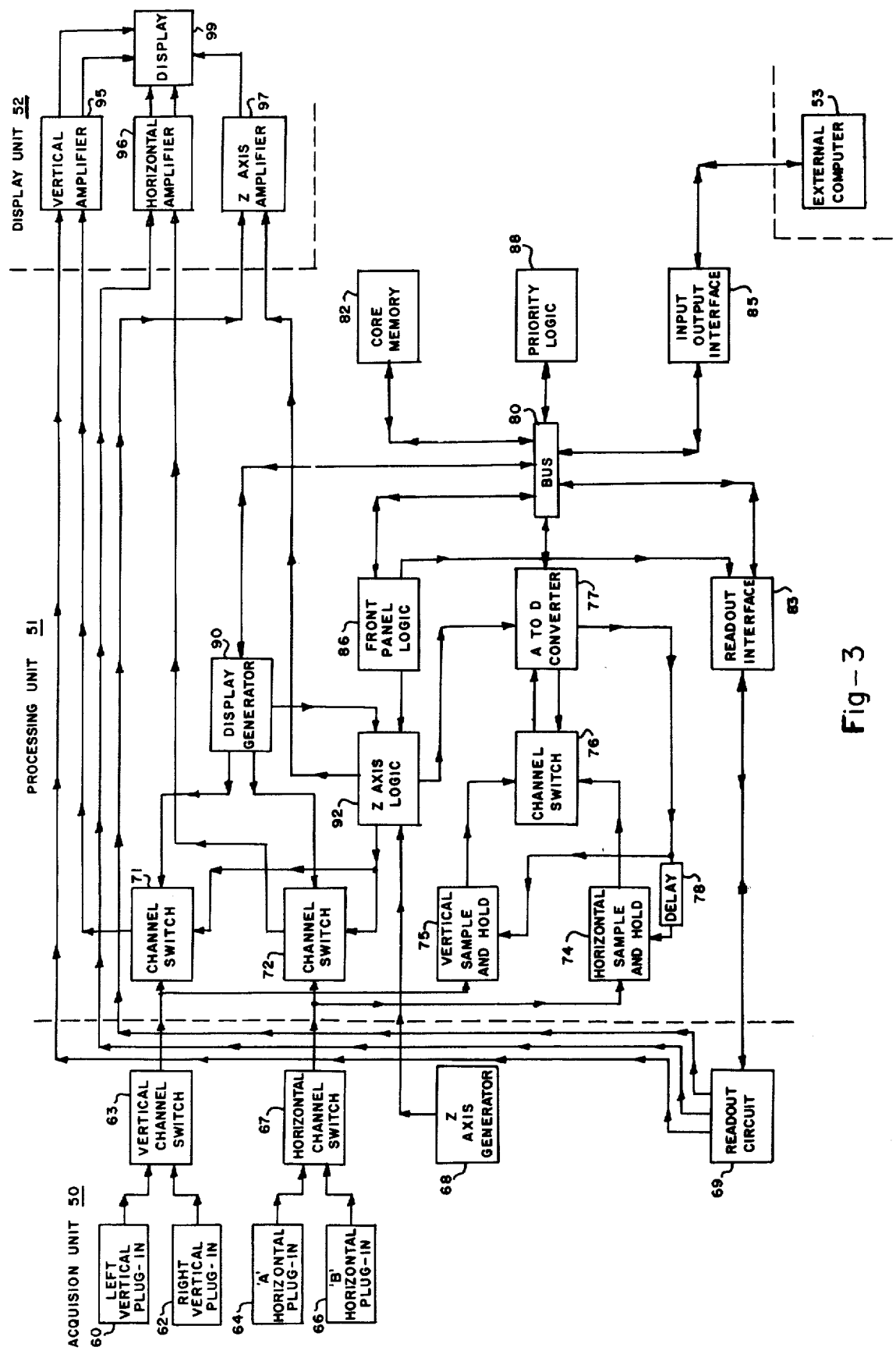
FIG. 3 shows a detailed block diagram of the present invention.

Referring to FIG. 1, a block diagram of the prior art is shown wherein a real-time signal corresponding to a single display axis is applied to input terminal 1. Block 2 is a conventional sample and hold circuit which takes repetitive samples of the instantaneous values of the input waveform and holds such a sample until the subsequent sample is taken. Block 3 is a conventional analog-to-digital converter which converts the instantaneous waveform voltage value to digital data. This digital data is then sent to memory unit 4. A triggering signal derived from the afore-mentioned real-time signal is applied to input terminal 5. Trigger circuit 6, usually a comparator, generates a trigger in response to the triggering signal. This trigger synchronizes clock circuit 7, whose accurate-period clock-pulse output is sent to counter circuit 8 to form the address pulses for the memory unit 4. In the manner just described, each digit derived from the real-time signal applied to terminal 1 is stored in a separate memory cell. The waveform information is then sent to digital computing machine 9 for processing; then the results are sent to the display device 10 for visual display, usually against a time base signal which is generated as the processed results are recalled from the computing machine 9.

Turning now to FIG. 2, a general block diagram according to the present invention is shown. All blocks contain conventional circuits, well known to those skilled in the art. As can be discerned, information corresponding to two axes of a graphic display system is applied simultaneously to input terminals 14 and 16. This information is available for immediate display and for processing. Sample/Hold circuits 18 and 20 take samples of the instantaneous voltage values of the input signals in the manner of conventional sampling circuits; however, as will be described later, a delayed strobe is employed to enable capturing data prior to the triggering event and to permit simultaneous categorization of both vertical and horizontal information so that they may be stored together as a coordinate point. Analog-to-digital converters 22 and 24 then convert the sampled voltage values to digital representations thereof, the vertical information becoming the "data" to be stored in memory unit 25 and the horizontal information becoming the "address" for locating the place in the memory unit 25 wherein the data will be stored.

The vertical and horizontal information stored in memory unit 25 can be recalled for processing by digital computing machine 27, or for display. Also, the processed information can be returned from the digital computing machine 27 to the memory unit 25. When the information is to be displayed, digital-to-analog converters 28 and 30 change the digital information into an analog form. Switching circuits 32 and 34 can select between real signals at terminals 14 and 16 or processed signals from digital-to-analog converters 28 and 30. The selected signal is then displayed by display device 35.

FIG. 3 shows a detailed block diagram of an oscilloscope system according to the present invention. The system comprises four units, acquisition unit 50, processing unit 51, display unit 52, and external computer 53. Acquisition unit 50 and display unit 52 can be connected together to form a conventional oscilloscope. The external computer 53 may be a minicomputer such as a PDP-11, manufactured by Digital Equipment Corporation of Maynard, Massachusetts. Unless otherwise mentioned, all blocks contain conventional circuits, well known to those skilled in the art.

Signals are acquired by left vertical plug-in unit 60 and right vertical plug-in unit 62 in the conventional manner, usually via a probe or a coaxial cable. Vertical plug-in units 60 and 62 typically comprise attenuators and switched-gain preamplifiers to provide a plurality of deflection factors. Vertical channel switch 63 selects between the output signals of the vertical plug-in units 60 and 62 to provide a vertical output signal from acquisition unit 50. 'A' horizontal plug-in 64 and 'B' horizontal plug-in 66 generate a plurality of selectable time-base signals, or sweeps. Plug-ins 64 and 66 can also comprise preamplifier channels for amplifying signals to be displayed on the horizontal axis. Horizontal channel switch 67 selects between the outputs of the plug-ins 64 and 66 to provide a horizontal output signal from the acquisition unit 50. Z-axis generator 68 produces signals to control the conduction of beam current in the cathode-ray tube; the z-axis signals generally cut the cathode-ray tube off to blank the display during movement of the electron beam not germane to the display information, such as between sweeps and unwanted portions of the display, and turns the cathode-ray tube on to display information. Readout circuit 69 produces alpha-numeric information corresponding to the signal information on both the vertical and horizontal axes. Since the readout information is displayed on-screen along with the displayed waveform, a z-axis signal is produced by readout circuit 69 in accordance with the alpha-numeric characters so that the cathode-ray tube can be turned off while the electron beam is being deflected to and from character positions. A typical such readout circuit is shown in U.S. Pat. No. 3,651,510.

In the processing unit 51, the vertical signal and horizontal signal are presented respectively to channel switches 71 and 72 to be routed to the display unit 52, and these signals are also presented respectively to vertical sample and hold circuit 73 and horizontal sample and hold circuit 74. The sample and hold circuits 73 and 74 take instantaneous samples of the waveform information and hold the samples until the next sample is taken. Channel switch 76 selects between the outputs of sample and hold circuits 73 and 74 and passes the selected voltage sample to analog-to-digital converter 77. Here the sample is converted to a digital representation thereof. The analog-to-digital converter 77 also contains a clock generator for generating sampling strobes for the sample and hold circuits 73 and 74 and for generating switching signals for the channel switch 76 to select between vertical and horizontal samples at the appropriate times. Since the horizontal time-base signal is slightly delayed in relation to the vertical information due to finite triggering and time-base start-up delays, the strobe to the horizontal sample and hold circuit 74 is delayed an appropriate length of time by delay line 78. This allows a close time match of vertical and horizontal information to prevent loss of the leading portion the vertical information.

The digital representations of the sampled waveform are routed from analog-to-digital converter 77 bia bus 80 to core memory 82. As previously described, the vertical information corresponds to "data" and horizontal information corresponds to "address". Core memory 82 is capable of storing several waveforms together with their respective alpha-numeric data, such as scale factors. The alpha-numeric data is routed to and from the readout circuit 69 via readout interface 83 and bus 80. Readout interface 83 provides compatibility between the analog system of the acquisition unit 50 and the digital system of the processing unit 51, and thus contains the required converters.

Data from the core memory 82 is routed to the external computer 53 via bus 80 and the input-output interface 85. The input output interface 85 provides compatability between the processing unit 51 and the external computer 53, and the exact circuitry thereof is dependent upon the computer use. For example, for the DEC PDP-11 mentioned earlier, the PDP-11 Handbook published in 1969 by Digital Equipment Corporation provides the necessary information for constructing interface 85, particularly chapters 8 and 9 thereof, which describe the PDP-11 Unibus, define all signals, provide example circuitry, and set forth general interfacing rules and appendices C and D which provide the necessary address map and timing charts. After manipulation by the computer, the data can be returned to the core memory 82 via the same path. The core memory 82 has the added capability of storing additional information from the computer, such as messages to be read out on the display screen.

Routing control of all signals in the system, as well as instructions to the external computer, is provided by the front-panel logic circuit 86, which provides a direct interface with the user and the system. Working in conjunction with front-panel controls, the front-panel logic circuit 86 develops control signals to select the source of display from the acquisition unit 50 or from the memory 82, or both, to select the data handling within the processing unit 51, e.g., store, hold, send to or receive from computer, etc., to select memory location of a waveform and its associated data, and to select computer programs to perform required functions. Depending upon the function selected, these control signals are routed to the appropriate circuits. Priority logic circuit 88 monitors the traffic activity over bus 80, selecting in turn each circuit requiring access to the bus 80 and thereby allowing one set of information over the bus 80 at one time.

Signals recalled for display are routed from core memory 82 over bus 80 to the display generator 90. The circuitry of display generator 90 is disclosed in U.S. Pat. No. 3,824,382, in which digital representation of signals are converted to an analog form using a vector technique. The vertical and horizontal signals are recovered from the waveform and routed via channel switches 71 and 72 respectively to the display unit 52.

The z-axis logic circuit 92 receives inputs from z-axis generator 68, front-panel logic 86, and display generator 90, and produces a z-axis signal which corresponds to the waveform being displayed. The z-axis signal is sent the display unit 52 to produce the appropriate display intensity. The display or portions thereof can be at different intensities, depending upon the z-axis signal, for example, dark, dim, normal, or bright. The z-axis logic circuit 92 also produces switching signals for the channel switches 71 and 72, ascertaining proper signal routing to the display unit 52. In addition, a sensing signal is sent to analog-to-digital converter 77 to ensure non-storage of any information sampled between sweeps.

The display unit 52 consists of vertical amplifier 95, horizontal amplifier 96, z-axis amplifier 97 and display 99. Amplifier 95 and 96 are conventional push-pull amplifiers which amplify the vertical and horizontal signals from switching circuits 71 and 72 in a manner suitable to drive the deflection plates of the cathode-ray tube of display 99. These amplifiers receive readout information from readout circuit 69 to provide proper amplification of the display-associated alpha-numeric characters. Z-axis amplifier 97 receives z-axis signals from z-axis logic circuit 92 and readout circuit 69, and produces a voltage level which is applied to the grid of the cathode-ray tube of display 99 to control its conduction. While display 99 is a cathode-ray tube in this embodiment, it is understood that any type of display could be used, for example, recording pens.

Figure 4:
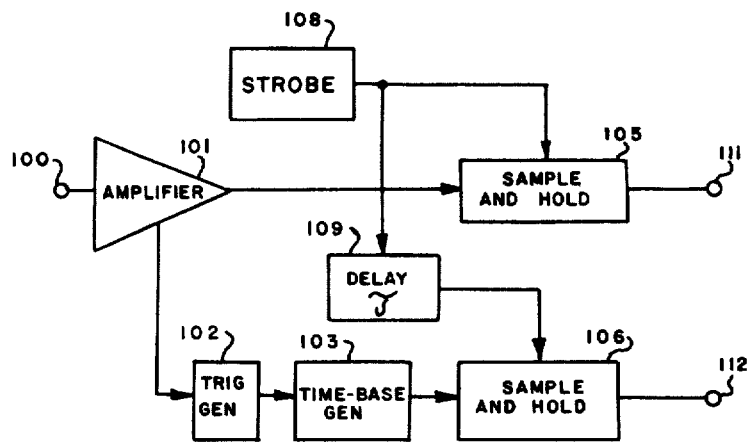
FIG. 4 shows a block diagram of the sampling system according to the present invention.
Figure 5:
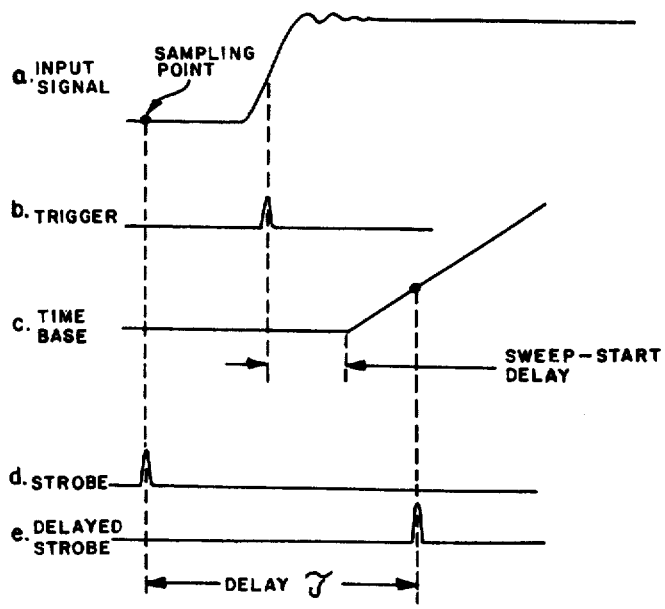
FIG. 5 shows a waveform ladder diagram illustrating the strobe timing of the sampling system of FIG. 4.

Turning now to FIG. 4, a block diagram of the sampling system according to the present invention is shown. Corresponding waveforms are shown in the ladder diagram of FIG. 5. An input signal corresponding to FIG. 5a is applied to input terminal 100 of FIG. 4. Amplifier 101, which may be a conventional vertical amplifier in an oscilloscope, amplifies the signal to the appropriate scale. A triggering signal is picked off from amplifier 101 and fed to a standard trigger generator 102, where a trigger corresponding to that shown in FIG. 5b is produced. Time-base generator 103, which is a conventional sweep circuit, receives the trigger, and after a finite time interval, the time-base sweep sawtooth begins to linearly run up. The time-base signal corresponds to FIG. 5c. Sample and hold circuits 105 and 106 consist of standard sampling diodes and storage capacitors. Strobe circuit 108 generates sampling strobes at a clocked rate which is random with respect to the vertical and time-base signals. The sampling strobe corresponding to FIG. 5d is applied simultaneously to the vertical sample and hold circuit 105 and to delay circuit 109. After a delay period, the strobe, corresponding to FIG. 5e, is applied to the horizontal sample and hold circuit 106. The delayed sampling strobe thus eliminates the need for a vertical delay line or a pretriggering time-base signal. The output samples are then available at output terminals 111 and 112.

While we have shown and described the preferred embodiments of our invention, it will be apparent to those skilled in the art that many changes and modifications may be made without departing from our invention in its broader aspects.

We claim:

1. A display system which comprises in combination,
   (a) analog display means,
   (b) analog input means,
   (c) digital input means, and
   (d) switch means selectively coupled to one of said analog and digital input means and to said display means, said switch means including first converter means responsive to said selection of a digital input to convert said digital input to an analog input, further including second converter means coupled to said analog input means for converting said input signal to digital form and storage means connected to said second converter means for storing ordered pairs of signals in digital form indicative of individual points of analog signals at said analog input means, wherein said second converter means and said storage means comprise:
   a memory and means coupled to said memory and said analog input means which includes an amplifier coupled to said analog input means, a first sample and hold circuit coupled to said amplifier, a trigger generator coupled to said amplifier, a time base generator driven by said trigger generator, a second sample and hold circuit driven by said gate generator, a strobe circuit driving said first sample and hold circuit, a delay circuit coupled to said strobe circuit and said second sample and hold circuit, said first sample and hold circuit providing data for storage in said memory, said second sample and hold circuit providing the address in said memory for storage of said data.

2. A display system as set forth in claim 1 wherein said analog display means is a cathode ray oscilloscope.

3. A display system as set forth in claim 2 wherein said digital input means is connected to the output of said memory.

4. A display system as set forth in claim 1 wherein said digital input means is connected to the output of said memory.

* * * * *

UNITED STATES PATENT AND TRADEMARK OFFICE
CERTIFICATE OF CORRECTION

PATENT NO. : 4,225,940

DATED : Sep. 30, 1980

INVENTOR(S) : HIRO MORIYASU, JACK A. GILMORE, WILLEM B. VELSINK, LUIS J. NAVARRO

It is certified that error appears in the above–identified patent and that said Letters Patent are hereby corrected as shown below:

Inventor: Change "Havarro" to --Navarro--

Column 2, Line 49, Change "to" to --of--.

Column 3, Line 7, Change "afore-mentioned" to --aforementioned--.

Column 5, Line 47, Change "the display" to --to display--.

Signed and Sealed this

Third Day of February 1981

[SEAL]

Attest:

RENE D. TEGTMEYER

Attesting Officer     Acting Commissioner of Patents and Trademarks